(12) United States Patent
Lu et al.

(10) Patent No.: US 10,128,214 B2
(45) Date of Patent: *Nov. 13, 2018

(54) SUBSTRATE AND THE METHOD TO FABRICATE THEREOF

(71) Applicant: CYNTEC CO., LTD., Hsinchu (TW)

(72) Inventors: Bau-Ru Lu, Changhua County (TW); Ming-Chia Wu, Hsinchu (TW); Shao Wei Lu, Hsinchu County (TW)

(73) Assignee: CYNTEC CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/823,579

(22) Filed: Nov. 28, 2017

(65) Prior Publication Data

US 2018/0082979 A1 Mar. 22, 2018

Related U.S. Application Data

(63) Continuation of application No. 14/492,088, filed on Sep. 22, 2014, now Pat. No. 9,859,250.

(Continued)

(51) Int. Cl.
*H01L 23/13* (2006.01)
*H01L 23/36* (2006.01)
(Continued)

(52) U.S. Cl.
CPC .......... *H01L 25/0655* (2013.01); *H01L 23/13* (2013.01); *H01L 23/3121* (2013.01); *H01L 23/36* (2013.01); *H01L 23/3735* (2013.01); *H01L 23/4006* (2013.01); *H01L 23/49811* (2013.01); *H01L 23/5389* (2013.01); *H01L 23/552* (2013.01); *H01L 25/50* (2013.01); *H05K 1/115* (2013.01); *H05K 3/42* (2013.01); *H05K 5/0247* (2013.01); *H05K 5/065* (2013.01); *H05K 7/02* (2013.01); *H05K 7/20509* (2013.01);
(Continued)

(58) Field of Classification Search
CPC . H01L 25/0655; H01L 23/3121; H01L 23/13; H01L 23/36; H01L 23/5389; H01L 23/49811; H01L 23/4006; H01L 23/552; H01L 2224/45124; H01L 2924/13055; H01L 2224/45147; H01L 21/768; H01L 21/76816; H01L 21/76838; H01L 21/28026; H01L 21/823475; H01L 21/823871; H01L 25/16; H01L 27/14636; H01L 2224/19; H01L 2224/25; H01L 2225/06541
USPC ....... 257/774, 522, 419, 773, 758, 737, 499, 257/762, 764, 506; 438/303, 591, 618, 438/421, 584, 637, 783, 763
See application file for complete search history.

(56) References Cited

U.S. PATENT DOCUMENTS 9,859,250 B2 * 1/2018 Lu ..................... H01L 25/0655
2011/0201155 A1 * 8/2011 Kuroda ............... H01L 21/4853
438/113

* cited by examiner

*Primary Examiner* — Moin Rahman
(74) *Attorney, Agent, or Firm* — Min-Lee Teng; Litron Patent & Trademark Office

(57) ABSTRACT

The present invention discloses a substrate where the lateral surface of the substrate is formed to expose at least one portion of a via(s) for circuit connection. The substrate comprises a plurality of insulating layers; and a plurality of conductive layers separated by the plurality of insulating layers. A first lateral surface of the substrate is formed by the plurality of conductive layers and the plurality of insulating (Continued)

layers. The first lateral surface of the substrate comprises at least one first portion of a first via filled with a first conductive material.

20 Claims, 23 Drawing Sheets

Related U.S. Application Data

(60) Provisional application No. 61/918,684, filed on Dec. 20, 2013.

(51) Int. Cl.
*H01L 25/065* (2006.01)
*H01L 25/00* (2006.01)
*H01L 23/552* (2006.01)
*H05K 5/02* (2006.01)
*H05K 5/06* (2006.01)
*H05K 1/11* (2006.01)
*H05K 3/42* (2006.01)
*H05K 7/02* (2006.01)
*H05K 7/20* (2006.01)
*H01L 23/373* (2006.01)
*H01L 23/40* (2006.01)
*H01L 23/498* (2006.01)
*H01L 23/538* (2006.01)
*H01L 23/31* (2006.01)

(52) U.S. Cl.
CPC ........... *H01L 2224/45124* (2013.01); *H01L 2224/45147* (2013.01); *H01L 2224/48091* (2013.01); *H01L 2224/48137* (2013.01); *H01L 2924/13055* (2013.01); *Y10T 29/49117* (2015.01); *Y10T 29/49155* (2015.01); *Y10T 29/49165* (2015.01)

SUBSTRATE AND THE METHOD TO FABRICATE THEREOF

CROSS-REFERENCES TO RELATED APPLICATIONS

This application is a continuation of application Ser. No. 14/492,088, filed on Sep. 22, 2014, which claims priority of U.S. provisional application Ser. No. 61/918,684 filed on Dec. 20, 2013, each of which is hereby incorporated by reference herein and made a part of specification.

BACKGROUND OF THE INVENTION

Field of the Invention

The present invention relates to a substrate, and in particular, to a substrate used for a three-dimensional package structure.

Description of the Prior Art

Electronic package structures are formed by complicated package processes. Different electronic package structures have different electrical performances and capacities of heat dissipation, and therefore a designer may select an electronic package structure with a desired electrical performance and capacity of heat dissipation according to a design requirement.

FIG. 1 illustrates a schematic cross-sectional view of a conventional electronic package structure 10. Referring to FIG. 1, the electronic elements 12 (e.g., SBD or IGBT) are disposed on a top surface of the PCB (printed circuit board) 11 through the soldering pads 15 and electrically connected to the PCB 11. A first copper metallization sheet 16 can be disposed between the electronic elements 12 and the top surface of the PCB 11. Wire-bond 17 is applied for electrical interconnection. An encapsulating material 14 encapsulates the electronic elements 12. For external electrical connection, the assembly pins (e.g., bus bar connection) 18 are exposed outside the encapsulating material 14 in the form of DIP type. A housing 19 can cover the encapsulating material 14. A second copper metallization 21, a substrate attach material 22, a baseplate 23, a thermal grease 24 and a heat sink 25 can be disposed on the bottom surface of the PCB (e.g., for better heat dissipation). It's one of the main package processes in the industry due to its easiness, maturity, better reliability.

However, such kind of conventional process has many disadvantages including: a. leads are soldered to the top of the substrate to form pins, and pins will occupy a portion of design area; b. if the pin design is changed, the development work of another molding device is need; the single molding device can't be applied to all kinds of products. Accordingly, the present invention proposes a substrate and its manufacturing method to overcome the above-mentioned disadvantages.

SUMMARY OF THE INVENTION

One objective of the present invention is to provide a substrate where the lateral surface of the substrate is formed to expose at least one portion of a via(s) for circuit connection. The substrate comprises: a plurality of insulating layers; and a plurality of conductive layers separated by the plurality of insulating layers; wherein a first lateral surface of the substrate is formed by the plurality of conductive layers and the plurality of insulating layers, wherein the first lateral surface of the substrate comprises at least one first portion of a first via filled with a first conductive material.

In one embodiment of the present invention, a first lead is disposed on the first lateral surface of the substrate, wherein the first lead is electrically connected to the at least one first portion of the first via.

In one embodiment of the present invention, the at least one first portion of the first via is configured from a top surface of the substrate to a bottom surface of the substrate.

In one embodiment of the present invention, an adhesive is disposed on the first lead.

Another objective of the present invention is to provide a three-dimensional package structure. The three-dimensional package structure comprises: a substrate described above; and an electronic component disposed over the substrate and electrically connected to the plurality of conductive layers. In one embodiment, a molding body encapsulates the electronic component. In one embodiment, a first plastic frame is combined with the first lead and a second plastic frame is combined with the second lead, wherein the first plastic frame and the second plastic frame are adhered to a pair of opposing lateral surfaces of the molding body. In one embodiment, a dissipating plate is disposed on the molding body. In one embodiment, the dissipating plate has a plurality of pins soldered to a PCB (printed circuit board). In one embodiment, a package structure is disposed on the dissipating plate.

Another objective of the present invention is to provide a method for forming a substrate. The method comprises the steps of: (a) providing a sheet having a plurality of conductive layers, wherein the plurality of conductive layers comprises a first via filled with a conductive material; and (b) cutting the first via of the sheet to form the substrate having a lateral surface such that the lateral surface of the substrate comprises a second via which is at least one portion of the first via.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE INVENTION

The detailed explanation of the present invention is described as following. The described preferred embodiments are presented for purposes of illustrations and description and they are not intended to limit the scope of the present invention.

The following embodiments disclose a substrate and a method for manufacturing the substrate. The following embodiments also disclose a three-dimensional package structure and a method for manufacturing the three-dimensional package structure. The lateral surface of the substrate is formed to expose at least one portion of a via(s) for circuit connection. At least one portion of the via(s) is filled with a conductive material for bonding a lead(s) to the lateral surface of the substrate. The three-dimensional package structure has a relatively high utilization of the internal space and the design area, so that the size of electronic package structure can be reduced.

Figure 1:
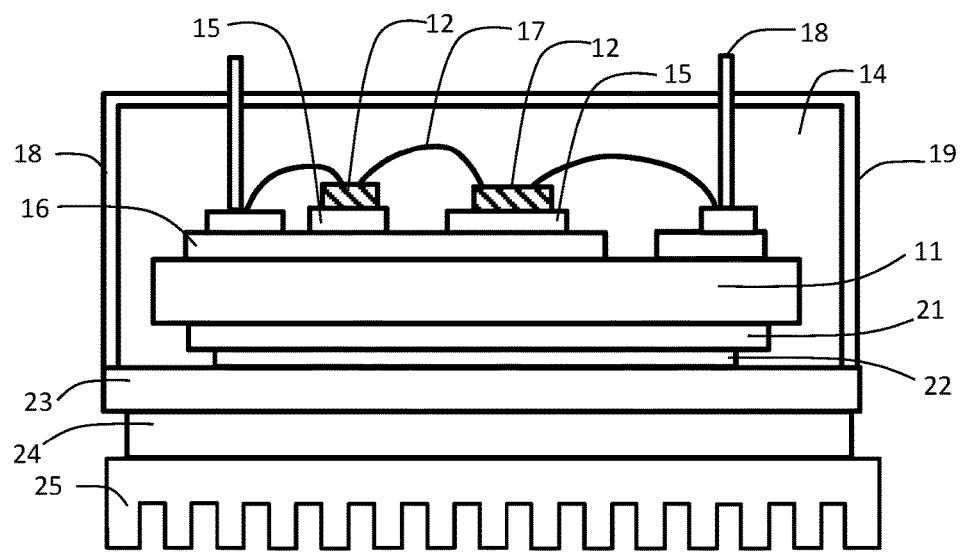
FIG. 1 illustrates a cross-sectional view of a conventional electronic package structure.
Figure 2A:
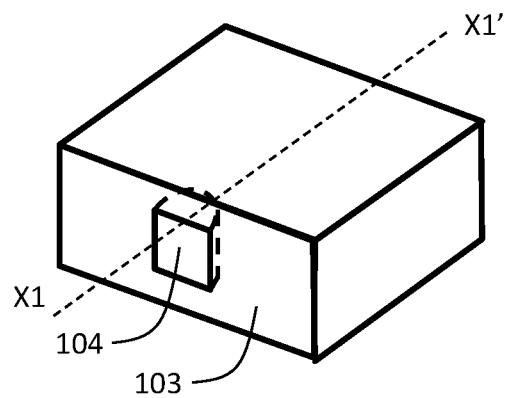
FIG. 2A illustrates a three-dimensional view of a substrate in accordance with the present invention.
Figure 2B:
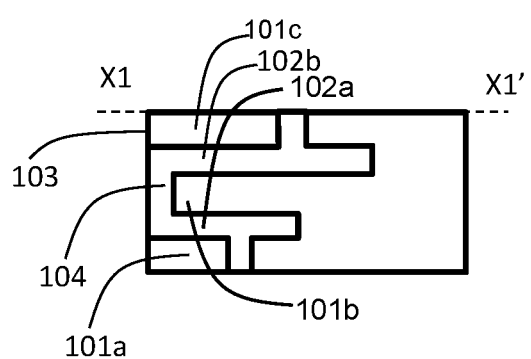
FIG. 2B illustrates a cross-sectional view of the substrate in FIG. 2A.
Figure 2C:
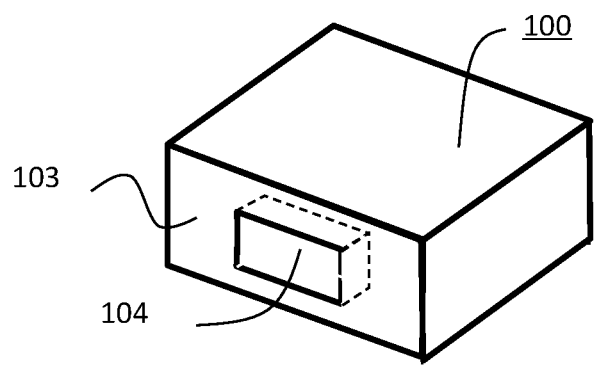
FIG. 2C illustrates a three-dimensional view of a substrate where the cross-sectional area, perpendicular to the lateral surface of the substrate, of at least one first portion of the first via is rectangular in accordance with the present invention.

FIG. 2A illustrates a three-dimensional view of a substrate 100 in accordance with the present invention. FIG. 2B illustrates a cross-sectional view of the substrate 100 in FIG. 2A. In reference to both FIG. 2A and FIG. 2B together, section $X_1$-$X_1$' in FIG. 2B is taken along the line $X_1$-$X_1$' shown in FIG. 2A. The substrate 100 comprises a plurality of insulating layers 101a, 101b, 101c and a plurality of conductive layers 102a, 102b separated by the plurality of insulating layers 101a, 101b, 101c; wherein a first lateral surface 103 of the substrate 100 is formed by the plurality of conductive layers 102a, 102b and the plurality of insulating layers 101a, 101b, 101c; wherein the first lateral surface 103 of the substrate 100 comprises at least one first portion of a first via 104 filled with a first conductive material. Please notice that a complete first via 104 is not shown because of the formation of the lateral surface 103 of the substrate 100, which will be described in detail hereafter. Moreover, the cross-sectional area, perpendicular to the lateral surface 103 of the substrate 100, of at least one first portion of a first via 104 can have any suitable shape, such as semi-circle or rectangle (see FIG. 2C).

Figure 2D:
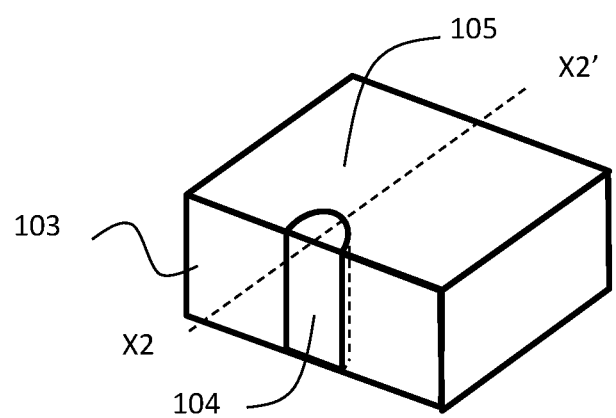
FIG. 2D illustrates a three-dimensional view of a substrate where at least one first portion of the first via is configured from the top surface of the substrate to the bottom surface of the substrate for strongly bonding a first lead in accordance with the present invention.
Figure 2E:
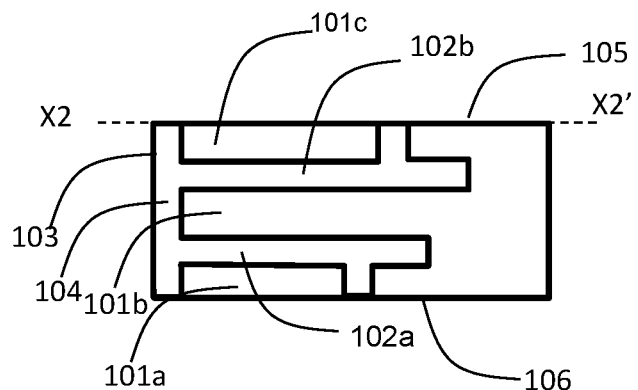
FIG. 2E illustrates a cross-sectional view of the substrate in FIG. 2D.
Figure 3A:
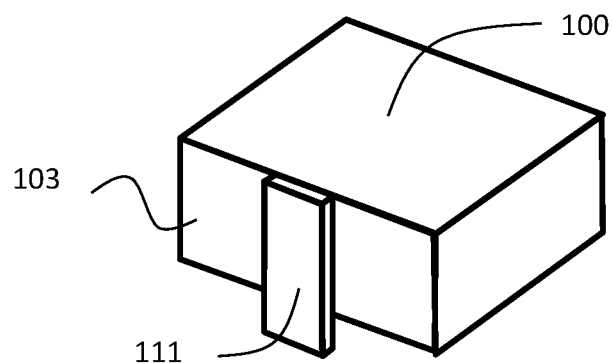
FIG. 3A illustrates a three-dimensional view of a substrate with a first lead in accordance with the present invention.

FIG. 2D illustrates a three-dimensional view of a substrate 100 where at least one first portion of the first via 104 is configured from the top surface 105 of the substrate 100 to the bottom surface 106 of the substrate 100 for bonding a first lead 111 in accordance with the present invention. FIG. 2E illustrates a schematic cross-sectional view of the substrate in FIG. 2D. In reference to both FIG. 2D and FIG. 2E together, section $X_2$-$X_2$' in FIG. 2E is taken along the line $X_2$-$X_2$' shown in FIG. 2D. FIG. 3A illustrates a three-dimensional view of a substrate 100 with a first lead 111 in accordance with the present invention. A first lead 111 can be disposed on the first lateral surface 103 of the substrate 100, wherein the first lead 111 is electrically connected to at least one first portion of the first via 104 (e.g., soldering by reflowing).

Figure 2F:
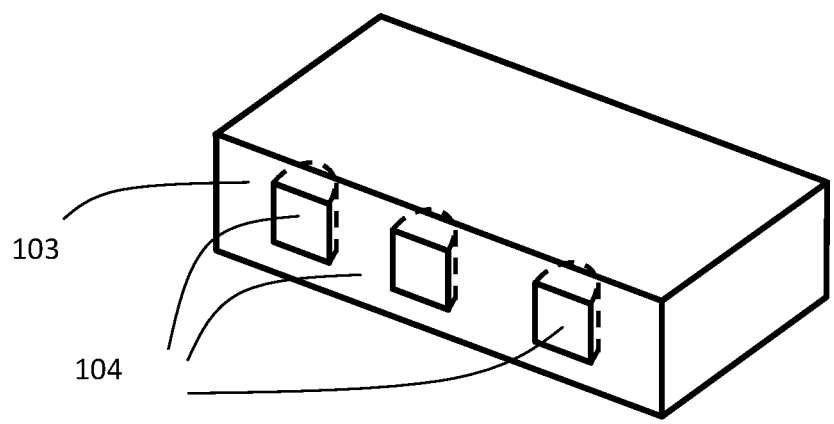
FIG. 2F illustrates a three-dimensional view of a substrate where the first lateral surface of the substrate comprises a plurality of at-least-one-portion-via each of which is a portion of a via or a complete via in accordance with the present invention.
Figure 3B:
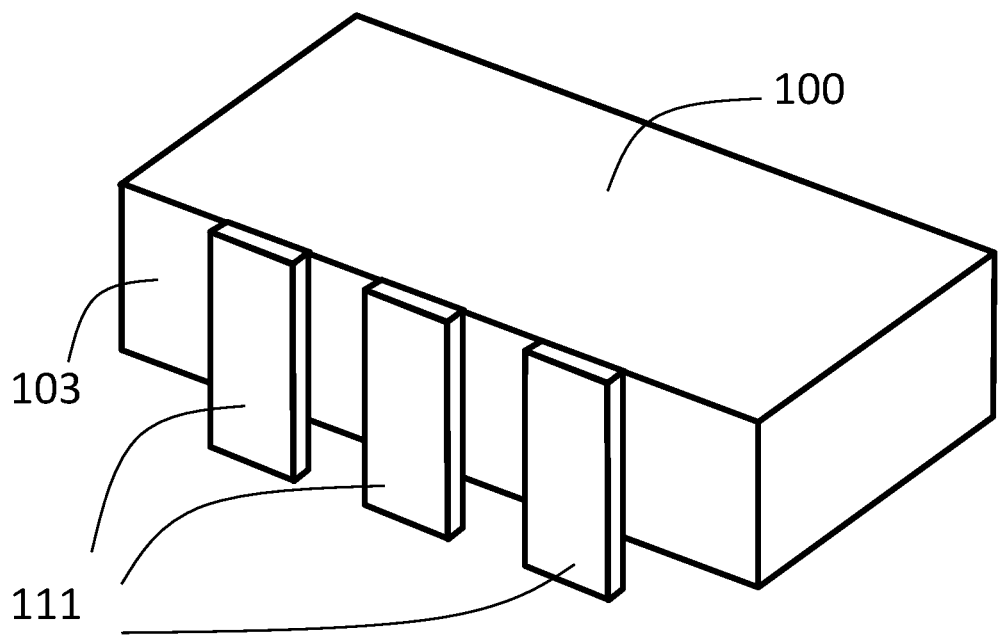
FIG. 3B illustrates a three-dimensional view of a substrate where a plurality of leads are disposed on the first lateral surface of the substrate in accordance with the present invention.

FIG. 2A to FIG. 2E illustrate that the first lateral surface 103 of the substrate 100 comprises at least one first portion of a first via 104. However, it is not limited to this case. In one embodiment, the first lateral surface 103 of the substrate 100 further comprises at least one second portion of a second via filled with a second conductive material. Preferably, the first conductive material is the same as the second conductive material. In another embodiment, the first lateral surface 103 of the substrate 100 comprises a plurality of at-least-one-portion-via 104 each of which is a portion of a via or a complete via. (see FIG. 2F). A plurality of leads 111 can be disposed on the first lateral surface 103 of the substrate 100, wherein each of the leads 111 is electrically connected to at least one portion of the corresponding via 104 (see FIG. 3B). In one embodiment, each of the leads 111 connected to a lead frame (the lead frame has a metallic base and a plurality of leads connected to the metallic base) is electrically connected (e.g., soldering) to at least one portion of the corresponding via 104 before the leads 111 are disconnected to the metallic base. An adhesive (not shown) can be disposed on the leads 111 to protect the interior of the substrate 100 from Sn movement (due to re-melting) or steam invasion.

Figure 3C:
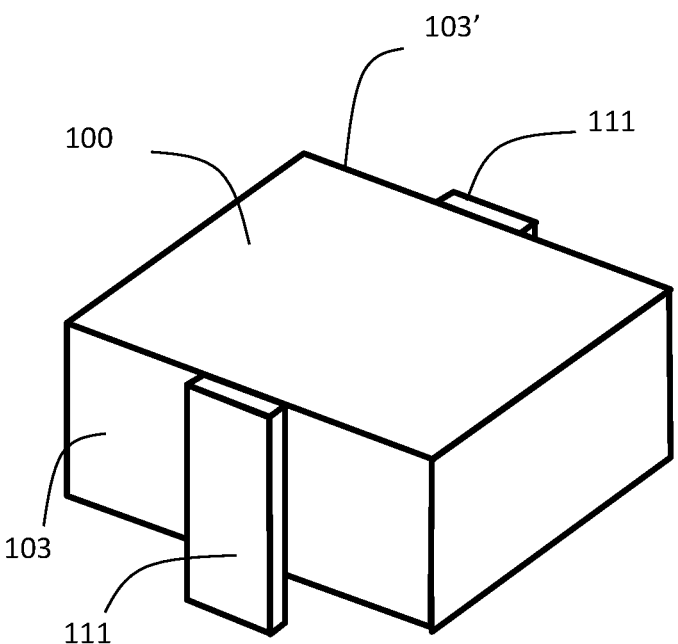
FIG. 3C illustrates a three-dimensional view of a substrate where a pair of leads are disposed on a pair of opposing lateral surfaces of the substrate in accordance with the present invention.
Figure 3D:
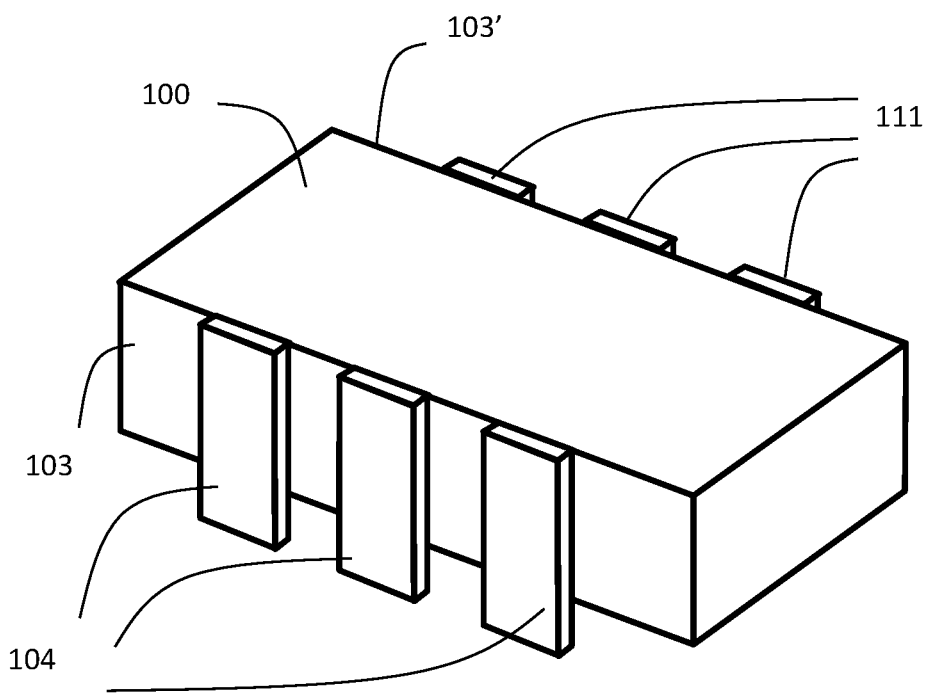
FIG. 3D illustrates a three-dimensional view of a substrate where each of a pair of opposing lateral surfaces of the substrate has a plurality of leads in accordance with the present invention.

In one embodiment, a pair of opposing lateral surfaces 103, 103' of the substrate 100 is formed by the conductive layers 102a, 102b and the insulating layers 101a, 101b, 101c, and each of a pair of opposing lateral surfaces 103, 103' of the substrate 100 comprises at least one portion of a corresponding via 104 filled with a corresponding conductive material. A pair of leads 111 can be respectively disposed on a pair of opposing lateral surfaces 103, 103' of the substrate 100, wherein each of a pair of leads 111 is electrically connected to at least one portion of the corresponding via 104 (see FIG. 3C). Each of a pair of opposing lateral surfaces 103, 103' of the substrate 100 comprises a plurality of at-least-one-portion-via 104 each of which is a portion of a via or a complete via, so each of a pair of opposing lateral surfaces 103, 103' of the substrate 100 has a plurality of leads 111 (see FIG. 3D).

Figure 4:
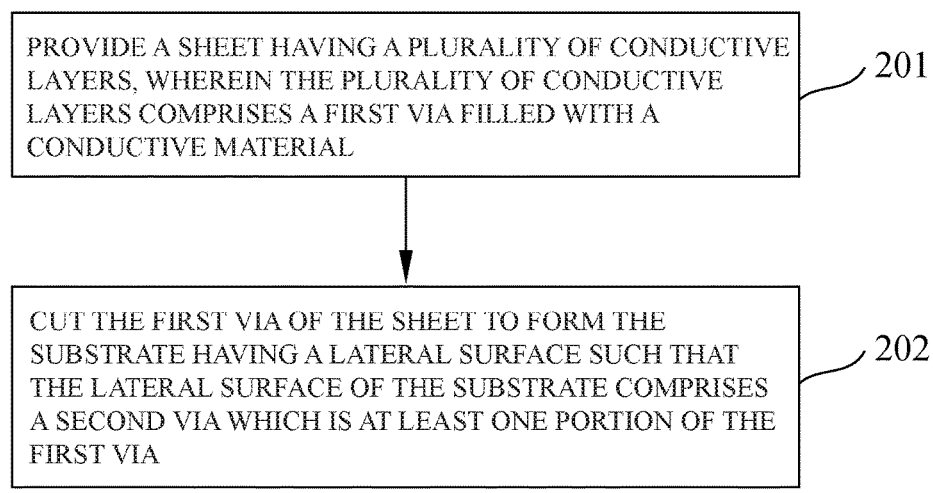
FIG. 4 illustrates a process flow of manufacturing the substrate.
Figure 5A:
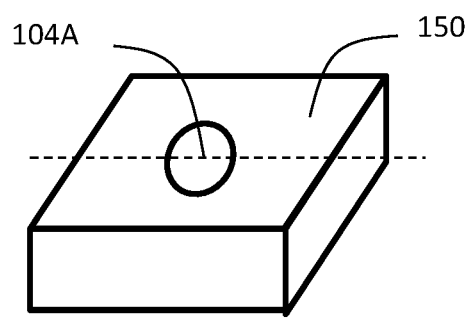
FIG. 5A illustrates a first via configured from the top surface of the sheet to the bottom surface of the sheet.
Figure 5B:
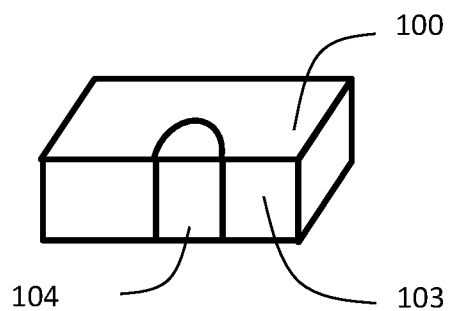
FIG. 5B illustrates a second via configured from the top surface of the substrate to the bottom surface of the substrate, wherein the second via is at least one portion of the first via.

FIG. 4 is a process flow of manufacturing the substrate 100. In step 201, a sheet 150 having a plurality of conductive layers (not shown) is provided, wherein the plurality of conductive layers comprises a first via 104A filled with a conductive material (see FIG. 5A). FIG. 5A illustrates the first via 104A configured from the top surface of the sheet 150 to the bottom surface of the sheet 150; however, the first via 104A can be embedded inside the sheet 150 as illustrated in FIG. 2A. In step 202, the first via 104A of the sheet 150 is cut to form the substrate 100 having a lateral surface 103 such that the lateral surface 103 of the substrate 100 comprises a second via 104, which is one portion of the first via 104A (see FIG. 5B).

Figure 6A:
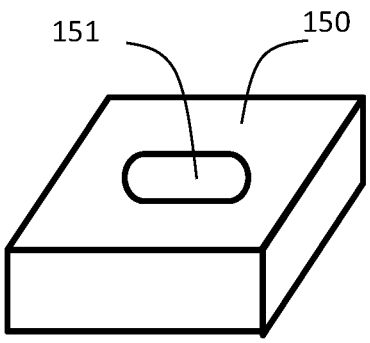
FIG. 6A to FIG. 6C illustrates a process flow of manufacturing the substrate.
Figure 6B:
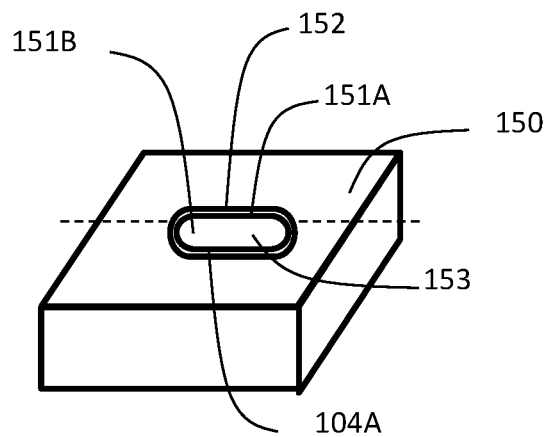
Figure 6C:
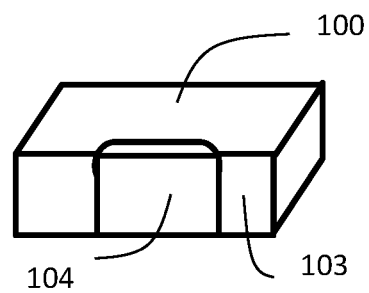

In one embodiment, step 201 comprises forming a through-hole 151 (e.g., mechanical drilling) in the sheet 150 and filling the conductive material in the through-hole 151 to form the first via 104A. Optionally, the through-hole 151 can be completely filled with the conductive material. Filling the conductive material in the through-hole 151 to form the first via 104A comprises: filling the conductive material 152 in a first portion 151A of the through-hole 151, wherein the first portion 151A is disposed on the surface of the through-hole 151; and filling a non-conductive material 153 (e.g., resin) in a second portion 151B of the through-hole 151, wherein the second portion 151B of the through-hole 151 is surrounded by the first portion 151A of the through-hole 151 (see FIG. 6A to FIG. 6C). The conductive material 152 can be filled by any suitable process, such as Cu electroplating. Preferably, Cu is disposed on the surface of the through-hole 151, and a resin can be filled in the center of the through-hole 151. After the lateral surface 103 of the substrate 100 is formed, the resin can be removed for subsequent lead-connection.

Figure 7A:
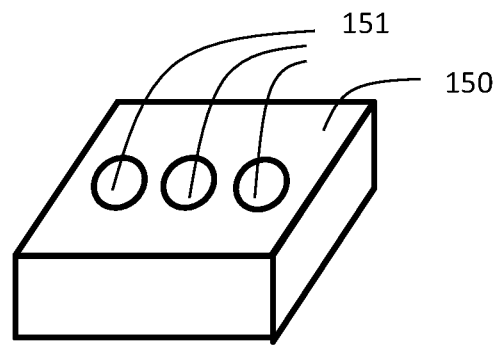
FIG. 7A to FIG. 7C illustrates a process flow of manufacturing the substrate.
Figure 7B:
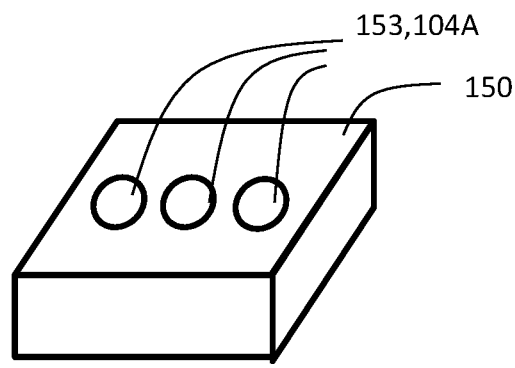
Figure 7C:
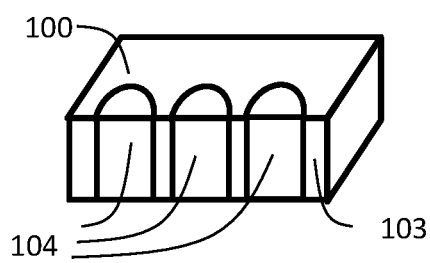

In one embodiment, the plurality of conductive layers comprises a plurality of first vias 104A, wherein step 201 comprises: forming a plurality of through-holes 151 in the sheet 150; and filling the conductive material 152 in the plurality of through-holes 151 to form the plurality of first vias 104A, and step b comprises: cutting the plurality of first vias 104A to form the substrate 100 having a lateral surface 103 such that the lateral surface 103 of the substrate 100 comprises a plurality of second vias 104 each of which is at least one portion of the corresponding first via (see FIG. 7A to FIG. 7C). Preferably, the through-holes are disposed substantially in a straight line.

The three-dimensional package structure 200 comprises a substrate 100 described above and an electronic component (not shown) disposed over the substrate 100 and electrically connected to the conductive layers 102. A first lead 111 is disposed on the first lateral surface 103 of the substrate 100, wherein the first lead 111 is electrically connected to at least one first portion of the first via 104.

In one embodiment, a second lateral surface 103' opposite to the first lateral surface 103 of the substrate 100 is formed by the conductive layers 102 and the insulating layers 101; wherein the second lateral surface 103' of the substrate 100 comprises at least one second portion of a second via 104 filled with a second conductive material. Preferably, the second conductive material is the same as the first conductive material. A first lead 111 and a second lead 111 are respectively disposed on the first lateral surface 103 of the substrate 100 and the second lateral surface 103' of the substrate 100; the first lead 111 and the second lead 111 are respectively electrically connected to at least one first portion of the first via 104 and at least one second portion of the second via 104. For convenience of explanation, the following embodiments recite that each of a pair of opposing lateral surfaces 103, 103' of the substrate 100 has a plurality of leads 111. However, the other embodiments can be applied; for example, one of a pair of opposing lateral surfaces 103, 103' of the substrate 100 can have a plurality of leads 111; each of a pair of opposing lateral surfaces 103, 103' of the substrate 100 can have a lead 111; or one of a pair of opposing lateral surfaces 103, 103' of the substrate 100 can have a lead 111.

In one embodiment, each of the leads 111 connected to a lead frame (the lead frame has a metallic base and a plurality of leads connected to the metallic base) is electrically connected (e.g., soldering) to at least one portion of the corresponding via 104 before the leads 111 are disconnected to the metallic base. An adhesive 130 can be disposed on the leads 111 to protect the interior of the substrate 100 from Sn movement (due to re-melting) or steam invasion. For convenience of explanation, the following embodiments comprise an adhesive 130 disposed on the leads 111. However, the adhesive is optional.

Figure 8A:
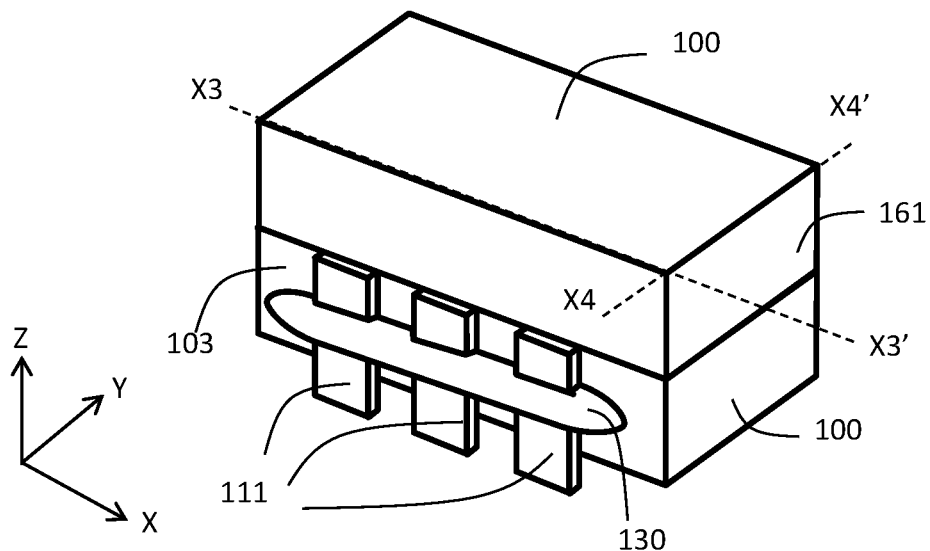
FIG. 8A to FIG. 8C illustrates a three-dimensional package structure having a molding body encapsulating the electronic component in accordance with the present invention.
Figure 8B:
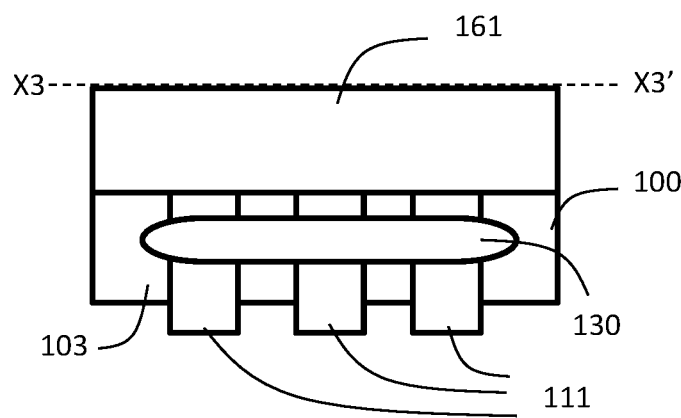
Figure 8C:
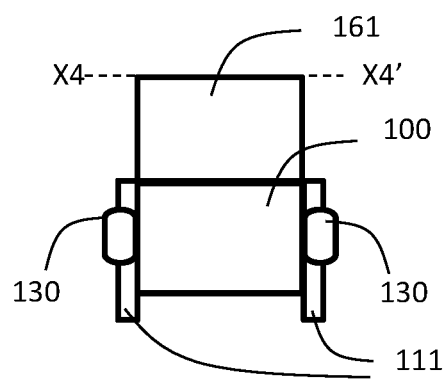

FIG. 8A illustrates a three-dimensional view of the three-dimensional package structure 200 having a molding body 161 encapsulating the electronic component (the electronic component is embedded in the molding body and not shown) in accordance with the present invention. FIG. 8B illustrates a schematic XZ-plane (passing the line $X_3$-$X_3'$) view of the three-dimensional package structure 200 in FIG. 8A. FIG. 8C illustrates a schematic YZ-plane (passing the line $X_4$-$X_4'$) view of the three-dimensional package structure 200 in FIG. 8A.

Figure 9A:
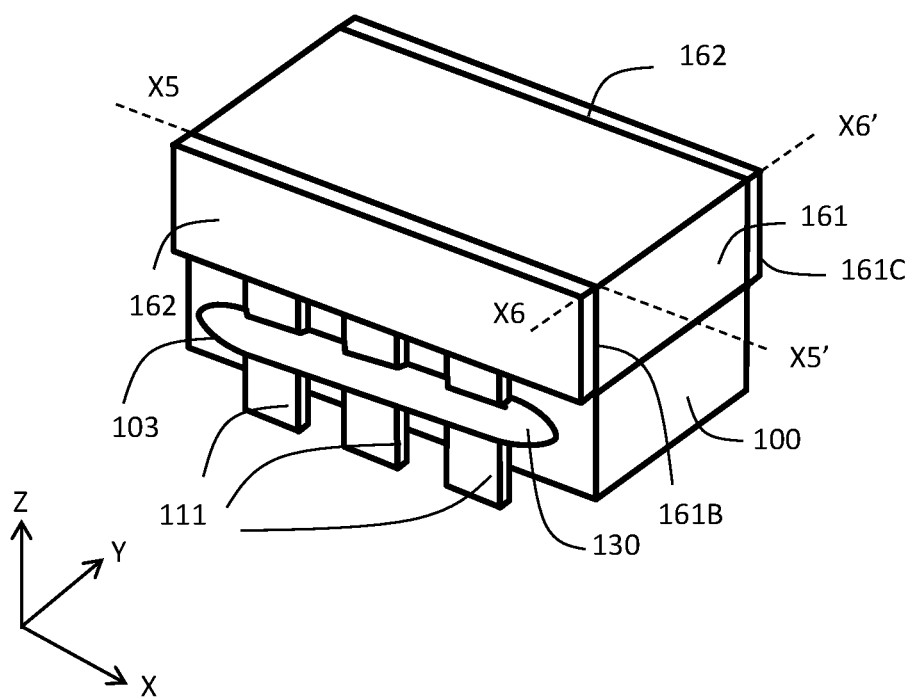
FIG. 9A to FIG. 9C illustrates a three-dimensional package structure having at least one plastic frame combined with the leads in accordance with the present invention.
Figure 9B:
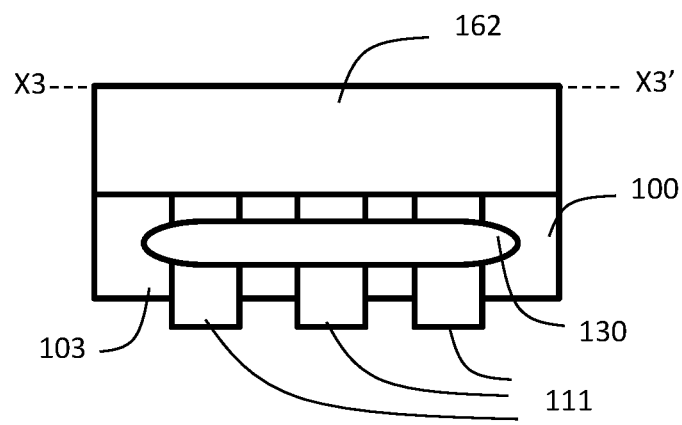
Figure 9C:
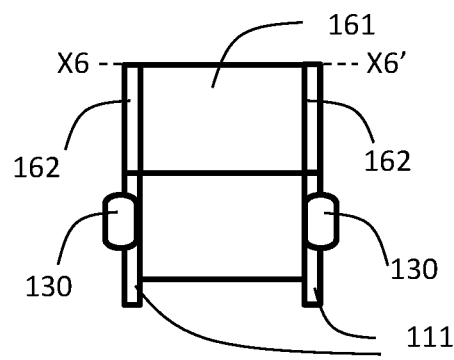

FIG. 9A illustrates a three-dimensional view of the three-dimensional package structure having at least one plastic frame 162 combined with the leads 111 in accordance with the present invention. FIG. 9B illustrates a schematic XZ-plane (passing the line $X_5$-$X_5'$) view of the three-dimensional package structure in FIG. 9A. FIG. 9C illustrates a YZ-plane (passing the line $X_6$-$X_6'$) view of the three-dimensional package structure in FIG. 9A. At least one plastic frame 162 combined with the leads 111 can be adhered to the molding body 161. At least one plastic frame 162 can have two plastic frames which are respectively adhered to a pair of opposing lateral surfaces 161B, 161C of the molding body 162.

Figure 10A:
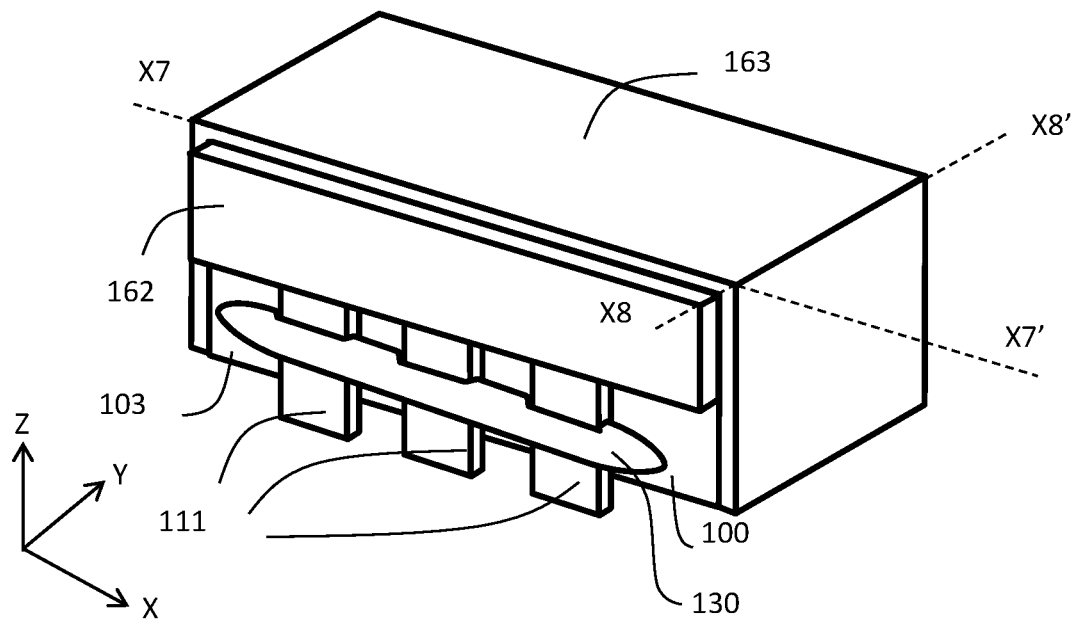
FIG. 10A to FIG. 10C illustrates a three-dimensional package structure having a dissipating plate used for dissipating and shielding in accordance with the present invention.
Figure 10B:
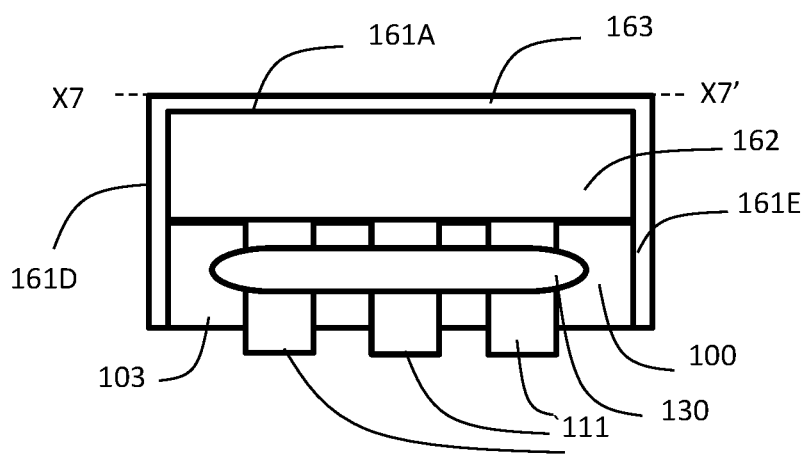
Figure 10C:
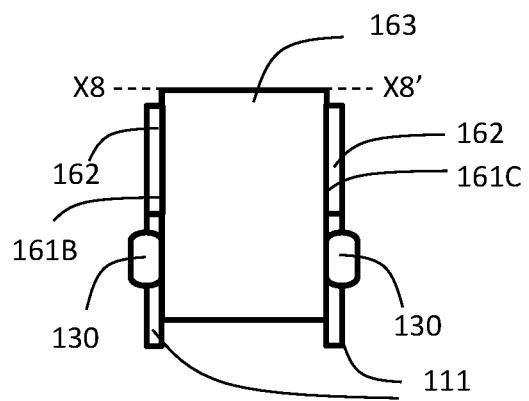

FIG. 10A illustrates a three-dimensional view of the three-dimensional package structure having a dissipating plate 163 (e.g., a copper plate) used for dissipating and shielding in accordance with the present invention. FIG. 10B illustrates a XZ-plane (passing the line $X_7$-$X_7'$) view of the three-dimensional package structure in FIG. 10A. FIG. 10C illustrates a YZ-plane (passing the line $X_8$-$X_8'$) view of the three-dimensional package structure in FIG. 10A. A dissipating plate 163 can be disposed on the molding body 161. In one embodiment, the molding body 161 has a top surface 161A, a pair of opposing lateral surfaces 161B, 161C respectively coplanar with a pair of opposing lateral surfaces 103, 103' of the substrate 100 where the leads 111 are disposed and a pair of opposing second lateral surfaces 161D, 161E; the dissipating plate 163 can be disposed on the top surface 161A and a pair of opposing second lateral surfaces 161D, 161E of the molding body 161. Optionally, two plastic frames 162 described above are respectively adhered to a pair of opposing first lateral surfaces 161B, 161C of the molding body 161. In one embodiment, a dissipating plate 163 can be connected to the leads 111; when more dissipating is need, the dissipating plate 163 (e.g., a copper plate) and the leads 111 can be integrated and combined such that double assemblies are not needed. In one embodiment, a dissipating plate 163 cannot be connected to the leads 111.

Figure 11A:
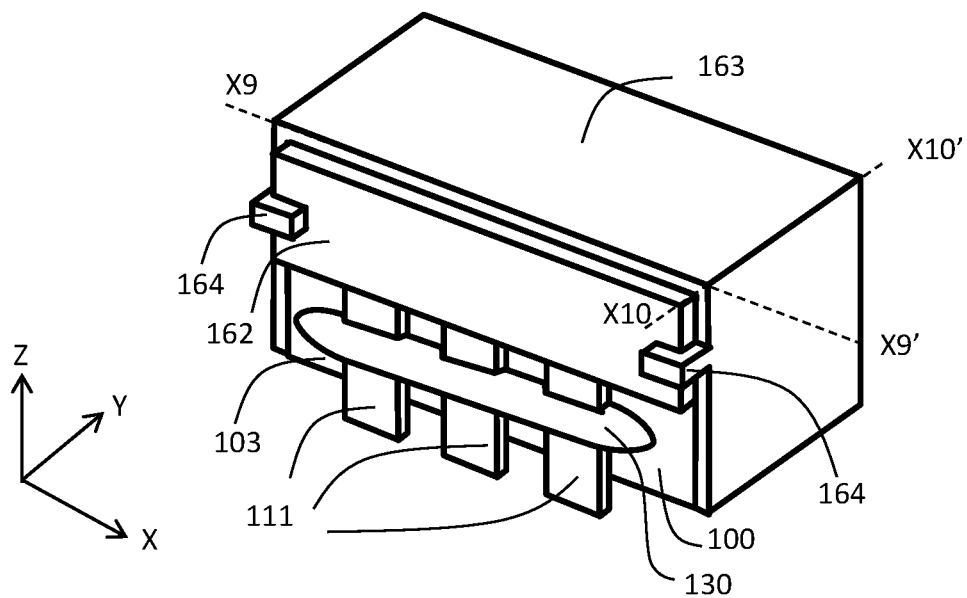
FIG. 11A to FIG. 11C illustrates a three-dimensional package structure where the dissipating plate has a snap(s) to buckle the plastic frame in accordance with the present invention.
Figure 11B:
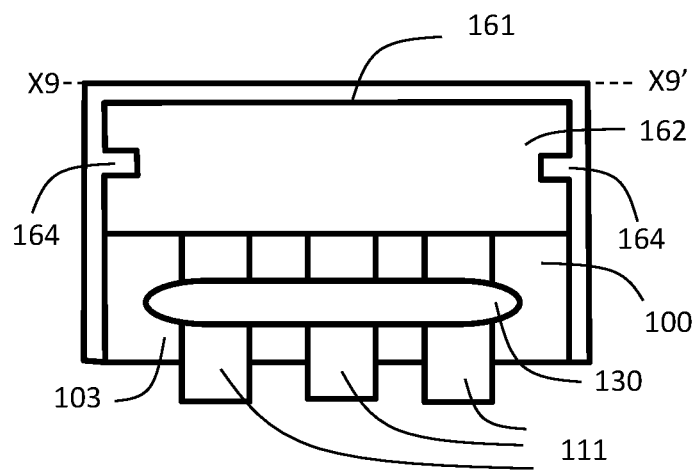
Figure 11C:
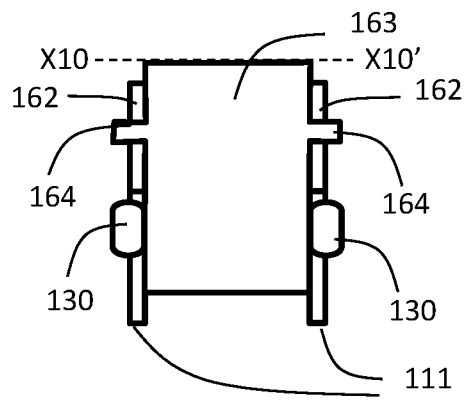

In one embodiment, the dissipating plate 163 (e.g., a copper plate) can have a snap(s) 164 to buckle the plastic frame 162 (see FIG. 11A to FIG. 11C). In another embodiment, the dissipating plate 163 can have a snap(s) 164 to buckle the leads 111. A snap(s) 164 added to the dissipating plate 163 makes assembly easier.

Figure 12A:
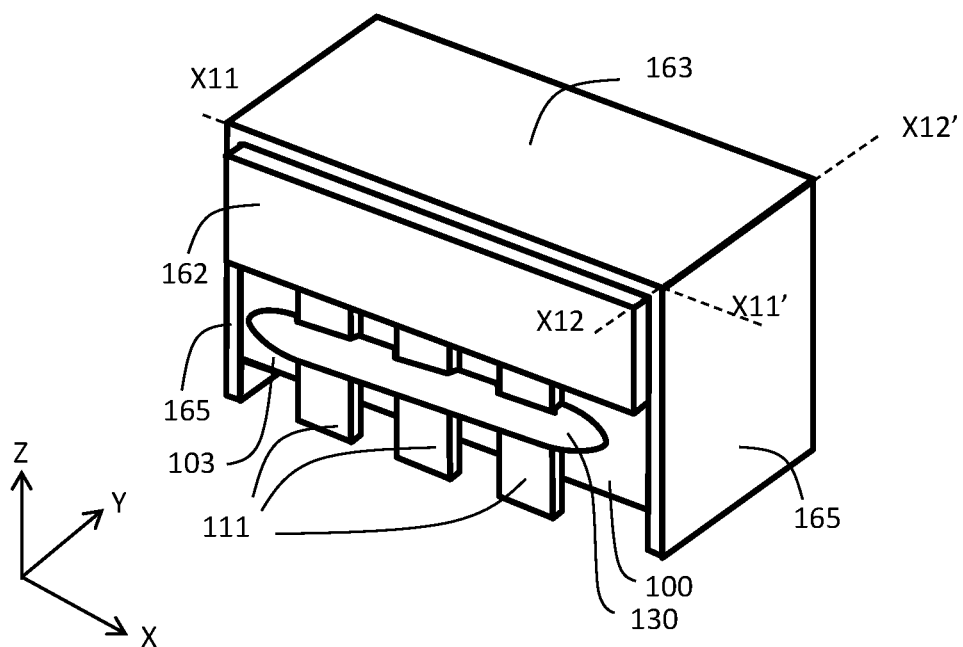
FIG. 12A to FIG. 12C illustrates a three-dimensional package structure where the dissipating plate has a plurality of pins soldered to a PCB in accordance with the present invention.
Figure 12B:
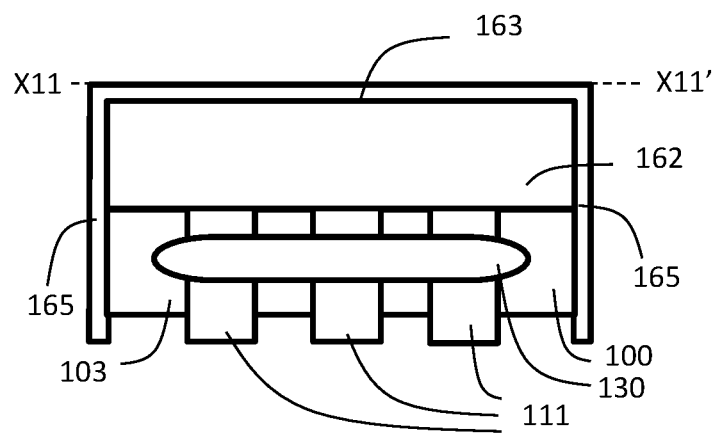
Figure 12C:
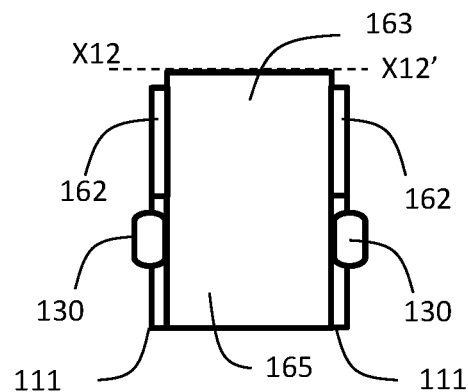

In one embodiment, the dissipating plate 163 (e.g., a copper plate) can have a plurality of (extended) pins 165 soldered to a PCB (printed circuit board) such that heat can be transferred to the PCB (see FIG. 12A to FIG. 12C).

Figure 13A:
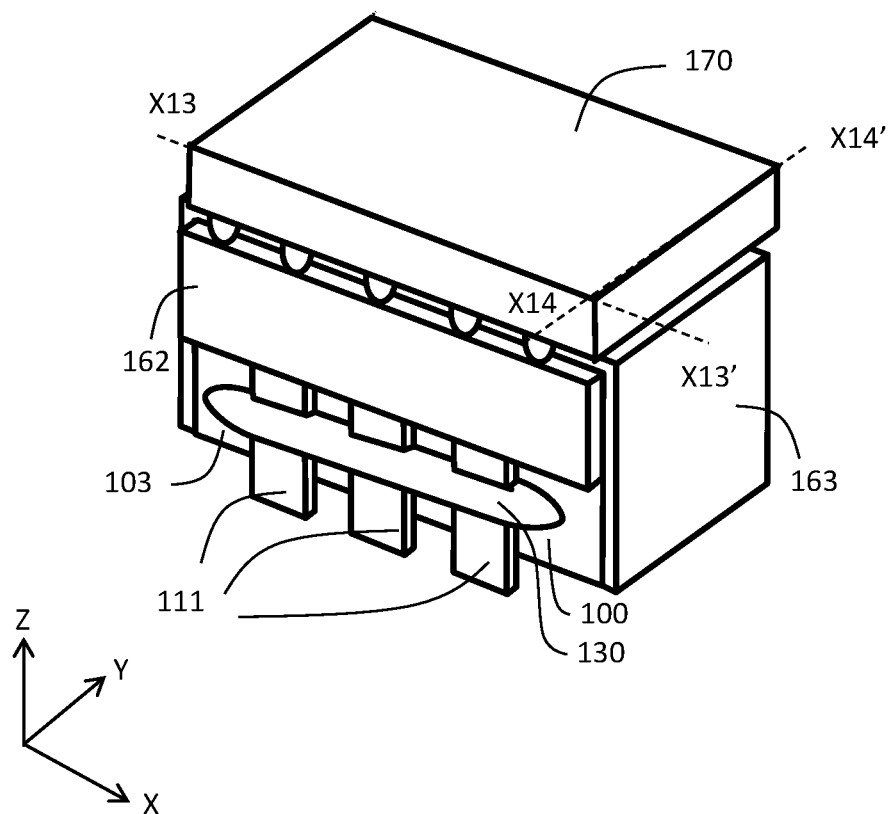
FIG. 13A to FIG. 13C illustrates a three-dimensional package structure where a package structure is disposed on the dissipating plate in accordance with the present invention.
Figure 13B:
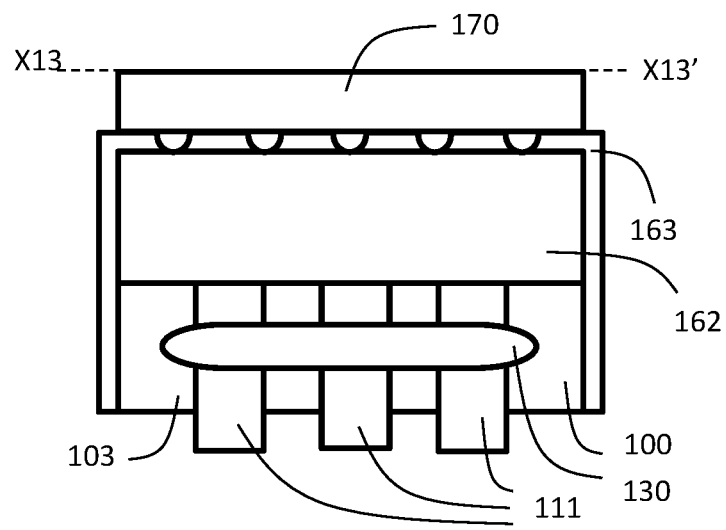
Figure 13C:
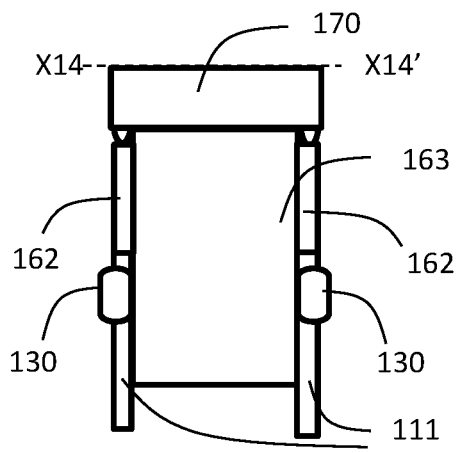
Figure 14A:
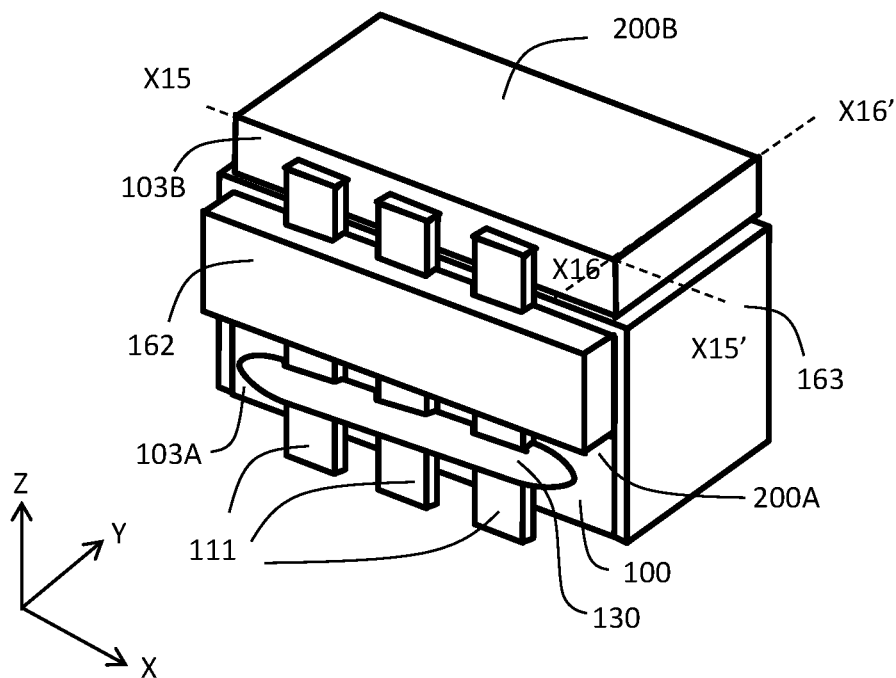
FIG. 14A to FIG. 14C illustrates a three-dimensional package structure where the leads are extended from a first three-dimensional package structure to a second three-dimensional package structure in accordance with the present invention.
Figure 14B:
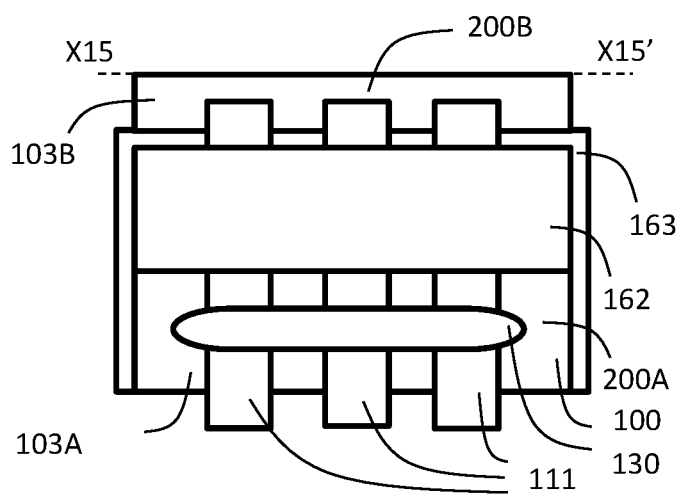
Figure 14C:
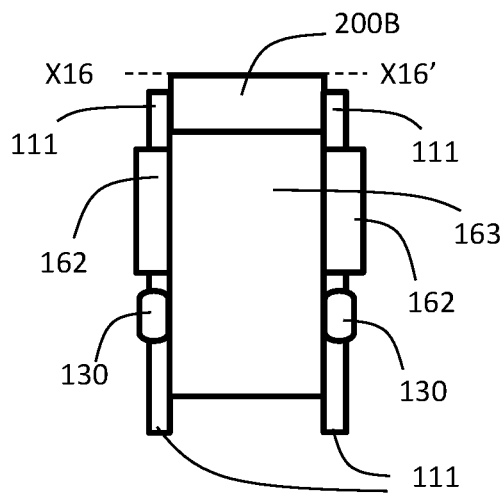
Figure 15A:
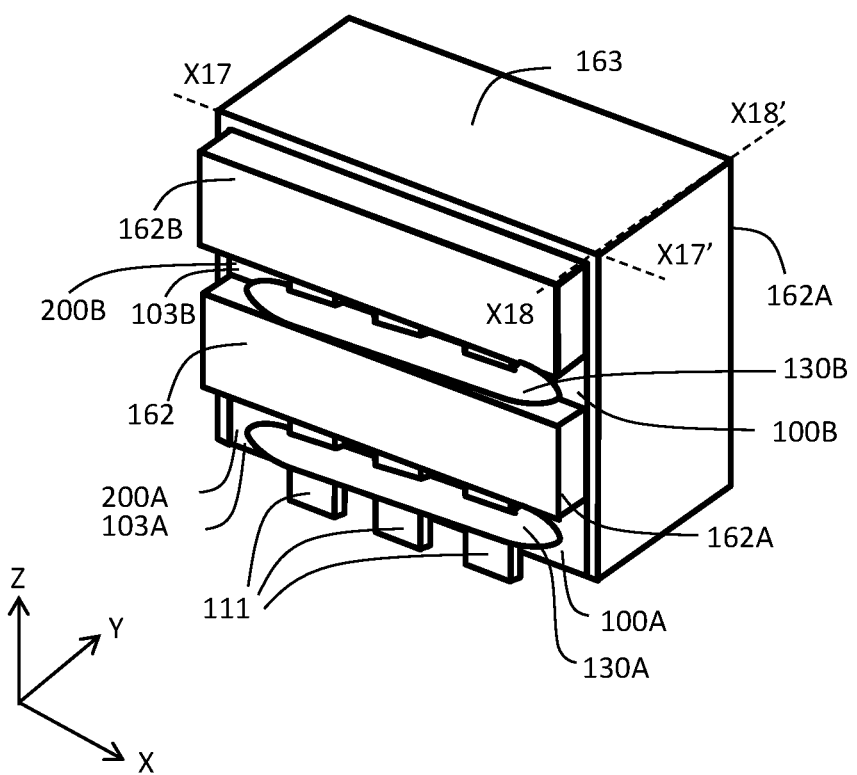
FIG. 15A to FIG. 15C illustrates a three-dimensional package structure where the dissipating plate is disposed on the molding body of the second three-dimensional package structure in accordance with the present invention.
Figure 15B:
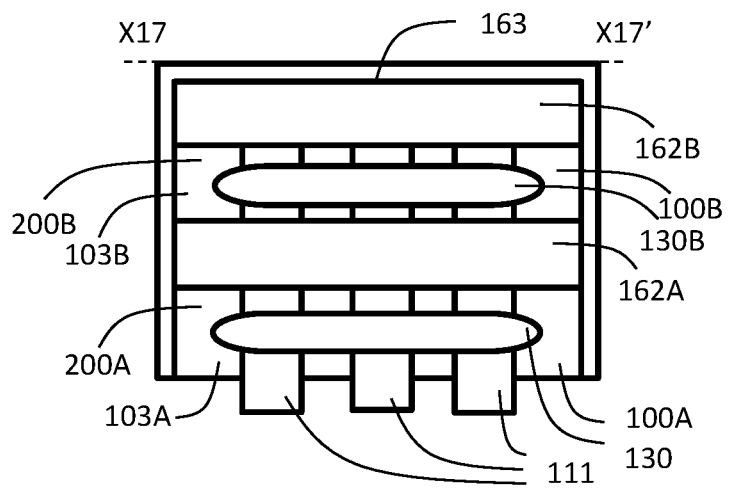
Figure 15C:
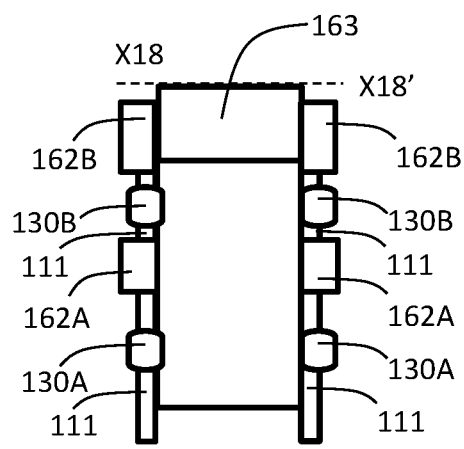
Figure 16:
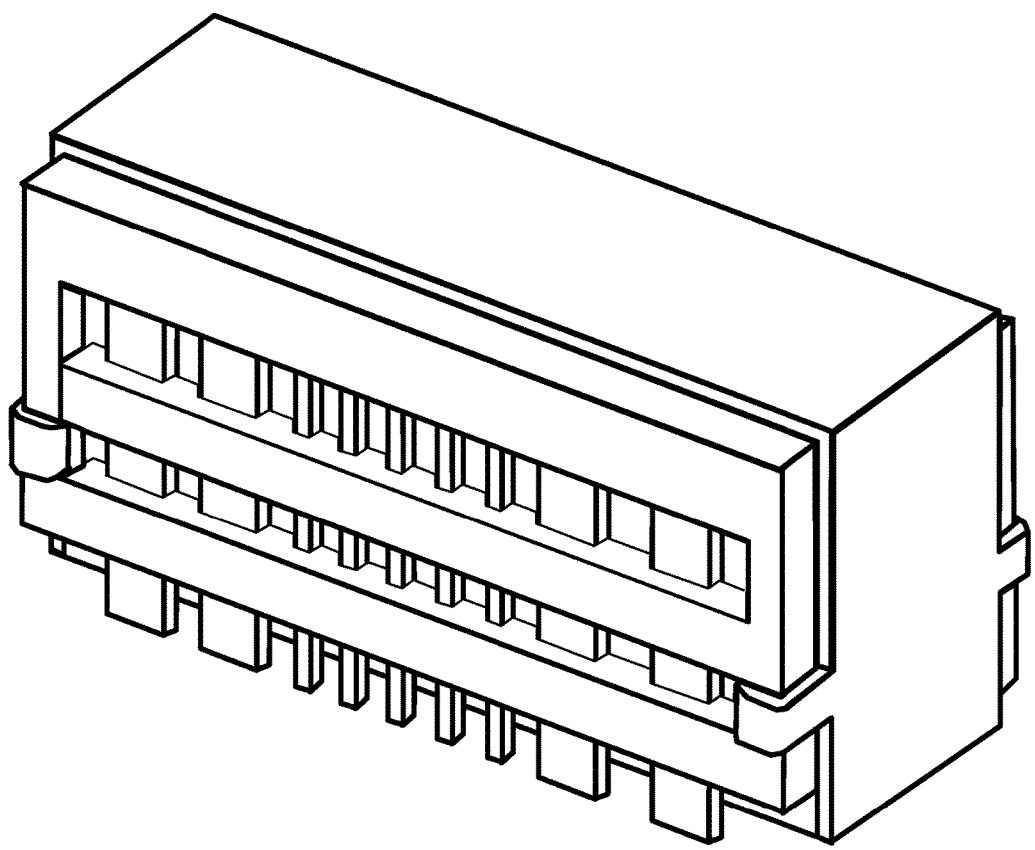
FIG. 16 illustrates a three-dimensional view of a product in accordance with the present invention.

In one embodiment, a package structure 170 can be disposed on the dissipating plate 163 such that heat generated by the package structure 170 can be dissipated through the dissipating plate 163 (see FIG. 13A to FIG. 13C). The package structure 170 may not be the same as the three-dimensional package structure 200 described above. Preferably, the package structure 170 may be the same as the three-dimensional package structure 200 described above. The leads 111 can be extended from a first three-dimensional package structure 200A to a second three-dimensional package structure 200B for electrically connecting at least one portion of a via disposed on the lateral surface 103A of the first three-dimensional package structure 200A to at least one portion of a via disposed on the lateral surface 103B of the second three-dimensional package structure 200B (see FIG. 14A to FIG. 14C). In one embodiment, a dissipating plate 163 can be disposed on the molding body 161 of the second three-dimensional package structure 200B (see FIG. 15A to FIG. 15C). FIG. 16 illustrates a schematic three-dimensional view of a product in accordance with the present invention.

It follows from description of the above embodiments that the substrate and the three-dimensional package structure in the present invention and the method for manufacturing the same can offer many advantages including: 1. the lateral surface of the substrate is formed to expose the at least one portion of a via(s) filled with a conductive material for bonding a lead(s) to the lateral surface of the substrate such that there is more design flexibility when the lead(s) is soldered on the PCB (printed circuit board); 2. a dissipating plate (e.g., a copper plate) disposed on the three-dimensional package structure or between the three-dimensional package structures can be used for dissipating and shielding; 3. when more dissipating is needed, the dissipating plate (e.g., a copper plate) and the lead(s) can be integrated and combined such that double assemblies are not needed; and 4. snaps added to the dissipating plate can make assembly easier; 5. pins added to the dissipating plate can transfer heat to the PCB.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A package structure, comprising:
a substrate, having a top surface, a bottom surface and a first lateral surface, said substrate comprising:
a plurality of insulating layers;
a plurality of conductive layers separated by the plurality of insulating layers;
wherein the first lateral surface of the substrate comprises at least one first portion of a first via that is in contact with a first conductive pattern of the plurality conductive layers, wherein said first conductive pattern is disposed between the top surface and the bottom surface of the substrate, wherein a first conductive material is filled in the at least one first portion of the first via, wherein the first lateral surface of the substrate further comprises at least one second portion of a second via, wherein a second conductive material is filled in the at least one second portion of the second via;
an electronic component, disposed over the top surface of the substrate and electrically connected to at least one portion of the plurality of conductive layers;
a first electrode, wherein at least one portion of the first electrode is disposed on the first lateral surface of the substrate and electrically connected to said first conductive pattern via the first conductive material filled in the at least one first portion of the first via; and
a second electrode, wherein at least one portion of the second electrode is disposed on the first lateral surface of the substrate and electrically connected to the second conductive material filled in the at least one second portion of the second via.

2. The package structure according to claim 1, further comprising an encapsulant to encapsulate the at least one electronic component.

3. The package structure according to claim 2, further comprising a heatsink disposed on the encapsulant.

4. The package structure according to claim 1, wherein said at least one first portion of the first via is configured from the top surface of the substrate to the bottom surface of the substrate.

5. The package structure according to claim 2, further comprising a dissipating plate disposed on the encapsulant, wherein said dissipating plate comprises at least one pin for connecting with an external board for transferring heat from said at least one electronic component to the external board via said dissipating plate and for shielding said at least one electronic component.

6. The package structure according to claim 1, further comprising an adhesive disposed on the first electrode for connecting with the at least one first portion of the first via.

7. The package structure according to claim 1, further comprising an adhesive disposed on the second electrode for connecting with the at least one first portion of the second via.

8. The package structure according to claim 1, wherein the at least one second portion of the second via is in contact with a second conductive pattern of the plurality conductive layers, wherein said second conductive pattern is disposed between the top surface and the bottom surface of the substrate.

9. A package structure, comprising:
- a substrate having a top surface, a bottom surface and a first lateral surface and a second lateral surface opposite to the first lateral surface, said substrate comprising:
- a plurality of insulating layers;
- a plurality of conductive layers separated by the plurality of insulating layers;
- wherein the first lateral surface of the substrate comprises at least one first portion of a first via that is in contact with a first conductive pattern of the plurality conductive layers, wherein said first conductive pattern is disposed between the top surface and the bottom surface of the substrate, wherein a first conductive material is filled in the at least one first portion of the first via, and wherein the second lateral surface of the substrate comprises at least one second portion of a second via, wherein a second conductive material is filled in the at least one second portion of the second via;
- an electronic component, disposed over the top surface of the substrate and electrically connected to at least one portion of the plurality of conductive layers;
- a first electrode, wherein at least one portion of the first electrode is disposed on the first lateral surface of the substrate and electrically connected to said first conductive pattern via the first conductive material filled in the at least one first portion of the first via; and
- a second electrode, wherein at least one portion of the second electrode is disposed on the second lateral surface of the substrate and electrically connected to the second conductive material filled in the at least one second portion of the second via.

10. The package structure according to claim 9, further comprising an encapsulant to encapsulate the at least one electronic component.

11. The package structure according to claim 10, further comprising a heatsink disposed on the encapsulant.

12. The package structure according to claim 9, wherein said at least one first portion of the first via is configured from the top surface of the substrate to the bottom surface of the substrate.

13. The package structure according to claim 9, further comprising an adhesive disposed on the first electrode for connecting with the at least one first portion of the first via.

14. The package structure according to claim 10, further comprising a dissipating plate disposed on the encapsulant, wherein said dissipating plate comprises at least one pin for connecting with an external board for transferring heat from said at least one electronic component to the external board via said dissipating plate and for shielding said at least one electronic component.

15. A package structure, comprising:
- a substrate, having a top surface, a bottom surface and a first lateral surface, wherein the substrate comprises a plurality of conductive patterns therein, wherein a first lateral surface of the substrate comprises at least one first portion of a first conductive via and at least one second portion of a second conductive via;
- a first electrode, wherein at least one portion of the first electrode is disposed on the first lateral surface of the substrate and electrically connected to a first conductive pattern of the plurality of conductive patterns via the at least one first portion of the first conductive via, wherein the at least one first portion of the first conductive via is in contact with said first conductive pattern that is disposed between the top surface and the bottom surface of the substrate;
- a second electrode, wherein at least one portion of the second electrode is disposed on the first lateral surface of the substrate and electrically connected to a second conductive pattern of the plurality of conductive patterns via the at least one second portion of the second conductive via; and
- at least one electronic component, disposed over the top surface of the substrate and electrically connected to at least one portion of the plurality of conductive patterns.

16. The package structure according to claim 15, further comprising an encapsulant to encapsulate the at least one electronic component.

17. The package structure according to claim 16, further comprising a heatsink disposed on the encapsulant.

18. The package structure according to claim 15, wherein said at least one first portion of the first via is configured from the top surface of the substrate to the bottom surface of the substrate.

19. The package structure according to claim 15, further comprising an adhesive disposed on the first electrode for connecting with the at least one first portion of the first conductive via.

20. The package structure according to claim 16, further comprising a dissipating plate disposed on the encapsulant, wherein said dissipating plate comprises at least one pin for connecting with an external board for transferring heat from said at least one electronic component to the external board via said dissipating plate and for shielding said at least one electronic component.

* * * * *